(12) United States Patent
Worledge

(10) Patent No.: US 7,982,249 B2
(45) Date of Patent: *Jul. 19, 2011

(54) MAGNETIC TUNNEL JUNCTION TRANSISTOR

(75) Inventor: Daniel C. Worledge, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/824,168

(22) Filed: Jun. 26, 2010

(65) Prior Publication Data

US 2010/0258849 A1    Oct. 14, 2010

Related U.S. Application Data

(63) Continuation of application No. 12/118,873, filed on May 12, 2008, now Pat. No. 7,791,152.

(51) Int. Cl.
  *H01L 29/82* (2006.01)

(52) U.S. Cl. ........ 257/261; 257/259; 257/295; 257/421; 257/E29.059; 257/E29.061; 257/E29.323; 365/171

(58) Field of Classification Search ................ 257/256, 257/261, 295, 421, E29.323, E29.059, E29.061; 365/171
See application file for complete search history.

(56) References Cited

U.S. PATENT DOCUMENTS

| | | | |
|---|---|---|---|
| 6,839,273 B2 * | 1/2005 | Odagawa et al. | 365/171 |
| 2004/0165428 A1 * | 8/2004 | Odagawa et al. | 365/171 |
| 2010/0213558 A1 * | 8/2010 | Bae et al. | 257/421 |

* cited by examiner

*Primary Examiner* — Victor Mandala
(74) *Attorney, Agent, or Firm* — Ido Tuchman; Vazken Alexanian

(57) ABSTRACT

A magnetic tunnel junction transistor. In a particular embodiment, the magnetic tunnel junction transistor includes a tunnel barrier having a high resistance when in a non-ferromagnetic, state and a low resistance when in a ferromagnetic state. The tunnel barrier is switchable between the non-ferromagnetic and the ferromagnetic states.

19 Claims, 6 Drawing Sheets

MAGNETIC TUNNEL JUNCTION TRANSISTOR

CROSS-REFERENCE TO RELATED APPLICATIONS

This application is a continuation of and claims priority under 35 U.S.C. §120 to U.S. patent application Ser. No. 12/118,873 filed May 12, 2008 and issued on Sep. 7, 2010 as U.S. Pat. No. 7,791,152, the entire text of which is specifically incorporated by reference herein.

BACKGROUND OF THE INVENTION

1. Field of the Invention

The present invention relates to transistors, and more specifically to magnetic tunnel junction transistors.

2. Description of Background

Metal-oxide-semiconductor field-effect (MOSFET) transistors are ubiquitous in integrated circuits (also known as chips). Essentially, MOSFET transistors act as three-terminal amplifiers and switches that can be electrically connected to form complex digital and analog circuits. It is not uncommon for a single integrated circuit to contain billions of MOSFET transistors.

The dimensions of MOSFET transistors have become smaller and smaller as a result of many technological innovations. However, as MOSFET transistors continue to shrink in size, they near an absolute lower limit beyond which the transistor's operational characteristics break down.

SUMMARY OF THE INVENTION

One exemplary aspect of the invention is a magnetic tunnel junction transistor. The magnetic tunnel junction transistor includes an electrically conductive source electrode, an electrically conductive drain electrode, and an electrically conductive gate electrode. An electrically insulating material includes a first region and a second region, the first region positioned between the source electrode and the drain electrode, the electrically insulating material being switchable between non-ferromagnetic and ferromagnetic states. The gate electrode is positioned proximate the second region of the insulating material.

Another exemplary aspect of the invention is a method of operating a magnetic tunnel junction transistor. The magnetic tunnel junction transistor includes a source region, a drain region, a gate region, and an insulating material arranged, at least partially, between the source region and the drain region. An applying operation applies a first electric field between the source region and the drain region. An energizing operation energizes a magnetoelectric region in the insulating material such that the insulating material changes magnetic state.

Yet another exemplary aspect of the invention is that the magnetic tunnel junction transistor includes a tunnel barrier having a high resistance when in a non-ferromagnetic state, and a low resistance when in a ferromagnetic state, the tunnel barrier being switchable between the non-ferromagnetic and the ferromagnetic states.

DETAILED DESCRIPTION OF THE INVENTION

Figure 1A:
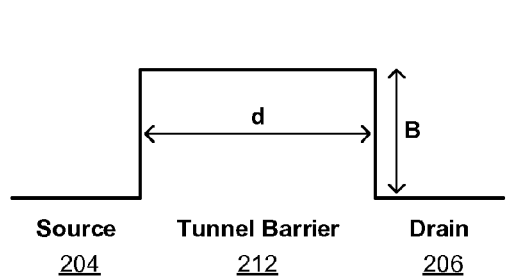
FIGS. 1A and 1B show a representational diagram of the source-drain region of a magnetic tunnel junction transistor contemplated by the present invention.

The present invention is described with reference to embodiments of the invention. Throughout the description of the invention reference is made to FIGS. 1-8. When referring to the figures, like structures and elements shown throughout are indicated with like reference numerals.

Figure 1B:
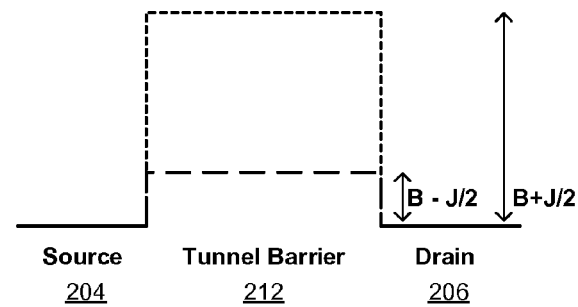

FIGS. 1A and 1B show a representational diagram of the source=drain region of the magnetic tunnel junction transistor. The transistor includes a source region 204, a drain region 206, and a tunnel barrier region 212. The source and drain regions 204, 206 include electrically conductive material, such as, but not limited to, metals and polycrystalline silicon.

The tunnel barrier region 212 comprises a thin-film of electrically insulating material. As shown, the tunnel barrier 212 has dimension of thickness d. In a particular embodiment of the invention, the thickness of the insulating material is less than 20 Angstroms.

Those skilled in the art will recognize that if an electric field is applied between the source region 204 and drain region 206, electrons may quantum-mechanically tunnel through the tunnel barrier 212, thereby causing a current to flow from the source region 204 to the drain region 206.

As discussed in more detail below, the tunnel barrier 212 between the source region 204 and drain region 206 can be switched from a non-ferromagnetic state to ferromagnetic state or from ferromagnetic state to non-ferromagnetic state under an external force. FIG. 1A shows the non-ferromagnetic state and FIG. 1B shows the ferromagnetic state. Those skilled in the art will appreciate that the total current passing from the source region 204 to the drain region 206 is equal to the sum of the spin-up electron current ($I_\uparrow$) and the spin-down electron current ($I_\downarrow$):

$$I_{FM} = I_\uparrow + I_\downarrow \quad \text{[Equation 1]}$$

Furthermore, the tunnel barrier in the non-ferromagnetic state has the tunnel barrier height (B) for both spin-up and spin-down electrons. The tunnel barrier in the ferromagnetic state has the relatively large spin-down tunnel barrier height (B+J/2) and the relatively small spin-up tunnel barrier height (B−J/2), where J is the exchange splitting. Thus, the total current in the non-ferromagnetic state is dictated by:

$$I_{NFM} \approx I_0 e^{-2Kd} \quad \text{[Equation 2]}$$

$$\text{where } \kappa = \left[\frac{2mB}{\hbar^2}\right]^{1/2}$$

and in the ferromagnetic state is dictated by:

$$I_{FM} \approx I_0[1/2e^{-2K_\uparrow d} + 1/2e^{-2K_\downarrow d}] \qquad \text{[Equation 3]}$$

where $$K_\uparrow = \left[\frac{2m(B - J/2)}{\hbar^2}\right]^{1/2}$$

and $$K_\downarrow = \left[\frac{2m(B + J/2)}{\hbar^2}\right]^{1/2}$$

The spin-down component of Equation 3 is negligible compared to the spin-up component and can be ignored. Therefore, current flow through the transistor in the ferromagnetic state (or "on" state) is estimated as:

$$I_{FM} \approx \tfrac{1}{2} I_0 e^{-2K_\uparrow d} \qquad \text{[Equation 4]}$$

It is noted that in the non-ferromagnetic state (or the "off" state) only a relatively small leakage current passes through the source and drain regions 204 and 206, since $K > K_\uparrow$.

Figure 2A:
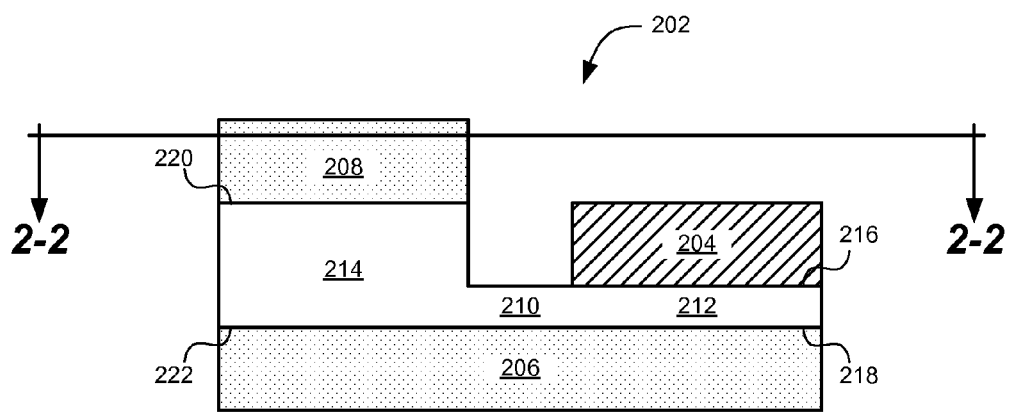
FIGS. 2A and 2B show one embodiment of the magnetic tunnel junction transistor contemplated by the present invention.
Figure 2B:
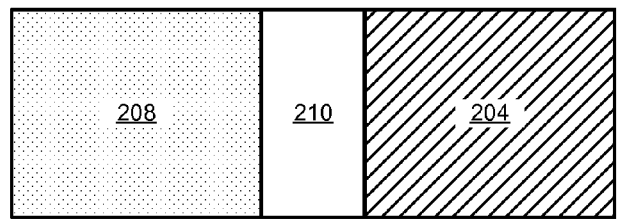

Turning now to FIGS. 2A and 2B, one embodiment of the magnetic tunnel junction transistor 202 contemplated by the present invention is shown. FIG. 2B is a cross sectional view of FIG. 2A along section line 2-2. The transistor 202 includes an electrically conductive source electrode 204, an electrically conductive drain electrode 206, and an electrically conductive gate electrode 208. As mentioned above, these electrodes can be made of various electrically conductive materials, such as normal metals and polysilicon. They could also be made of ferromagnetic metals, but do not need to be.

The transistor 202 further includes an electrically insulating material 210 with a first region 212 and a second region 214. The first region 212 of the insulating material 210 is positioned between the source electrode 204 and the drain electrode 206. As shown, the source electrode 204 is electrically coupled to a first surface 216 of the first region 212, and the drain electrode 206 is electrically coupled to a second surface 218 of the first region 212.

The first region 212 acts as a tunnel barrier between the source electrode 204 and the drain electrode 206. As discussed above, when the first region 212 is in a non-ferromagnetic state, very little current passes between the source electrode 204 and the drain electrode 206. When the first region 212 is in a ferromagnetic state, a relatively large amount of current passes between the source electrode 204 and the drain electrode 206.

The second region 214 of the insulating material 210 is magnetoelectric. Magnetoelectric material is defined herein as material that, under certain conditions, can be switched from a non-ferromagnetic state to a ferromagnetic state or from a ferromagnetic state to a non-ferromagnetic state under an external force (e.g., "energized"). External forces include, but are not limited to, an electric field and physical stress.

In a particular embodiment of the invention, the second region 214 of the insulating material 210 is thicker than the first region 212. Materials such as bismuth iron oxide (BiFeO$_3$) and chromium oxide (Cr$_2$O$_3$) are magnetoelectric at relatively large thicknesses and non-magnetoelectric at relatively small thicknesses. The embodiment of FIGS. 2A and 2B uses this characteristic to form the magnetoelectric second region 214 and the non-magnetoelectric first region 212. In one embodiment of the transistor 202, the first region 212 of the insulating material 210 is less than 20 Å thick and the second region 214 of the insulating material 210 is greater than 20 Å thick.

The gate electrode 208 is electrically coupled to a first surface 220 of the second region 214, and the drain electrode 206 is electrically coupled to a second surface 222 of the second region 214. With this arrangement, the magnetoelectric second region 214 can be energized by applying an electric field between the gate electrode 208 and the drain electrode 206.

During operation, the transistor 202 uses a property of magnetism called magnetic exchange to control current flow between the source and drain electrodes 204, 206. Magnetic exchange causes the magnetic state in one area of a material to be induced through the entire material. Thus, if one portion of the insulating material 210 is switched from a non-ferromagnetic state to a ferromagnetic state, the ferromagnetic state is induced throughout the entire insulating material 210 by magnetic exchange. Similarly, when one portion of the insulating material 210 is switched from a ferromagnetic state to a non-ferromagnetic state, the non-ferromagnetic state is induced throughout the entire insulating material 210.

By applying and removing an electric field across the magnetoelectric second region 214 of the insulating material 210, the entire insulating material 210, including the non-magnetoelectric first region 212, can be switched from a non-ferromagnetic state to a ferromagnetic state and vice-versa. In this manner, the electric field across the gate and drain electrodes 208, 206 controls current flow between the source and drain electrodes 204, 206.

Figure 3:
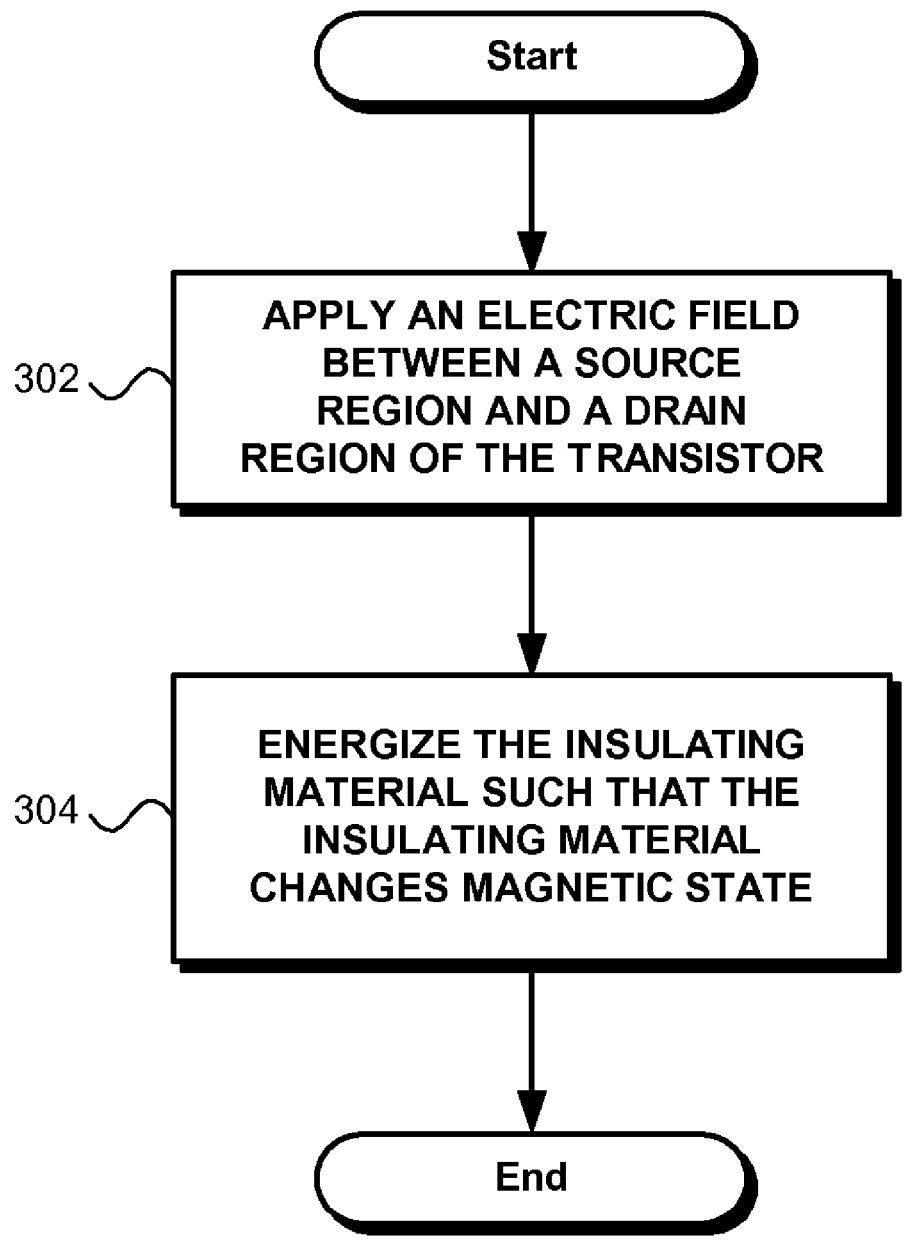
FIG. 3 shows a flow chart of a method of operating a magnetic tunnel junction transistor contemplated by the present invention.

FIG. 3 shows a flow chart of a method of operating a magnetic tunnel junction transistor contemplated by the present invention. It is noted that the order of steps shown in FIG. 3 can be reversed. At applying operation 302, a first electric field between a source region and a drain region is applied. In other words, an electric voltage is applied between the source electrode and drain electrode of the device.

Assuming the magnetoelectric region of the insulating material is not energized and the transistor is therefore off, neither spin-up nor spin-down electrons can tunnel easily through the insulating material. Thus, only a small amount of leakage current passes between the source and drain regions (see Equation 2). It should be emphasized that applying an electric potential between the source and drain electrodes does not cause the insulating material to change magnetic state. This is because the insulating material between the source and drain electrodes is thin enough that it is non-magnetoelectric.

At energizing operation 304, the magnetoelectric region of the insulating material is energizing such that the entire insulating material changes magnetic state. As used herein, a magnetic state of a material can be either ferromagnetic or non-ferromagnetic. As used herein, ferromagnetic means that there is a different tunnel barrier height for spin up and spin down electrons, and non-ferromagnetic means the tunnel barrier height is the same for both spins. In other words, the tunnel barrier has a high resistance in the non-ferromagnetic state and a low resistance in the ferromagnetic state.

In Cr$_2$O$_3$ for example, the non-magnetic state is anti-ferromagnetic. Since there is no net moment, the tunnel barrier height is the same for both spin up and spin down electrons. When the voltage is applied, the two sublattice spins cant together to form a net moment. This creates different tunnel barrier heights for spin up and spin down electrons. In one embodiment of the invention, energizing the magnetoelectric region of the insulating material includes applying a second electric field to the gate region. Because the insulating material is substantially thicker at the magnetoelectric region, very little leakage current passes from the gate electrode to the drain electrode. This beneficially makes the magnetic tunnel junction transistor very efficient.

It is contemplated that energizing the magnetoelectric region may include other actions, such as mechanically stressing the insulating material. In this case the magnetoelectric region is replaced with a magnetoelastic region, which can switch from ferromagnetic to non-ferromagnetic when a stress is applied. For example, the transistor may be configured with a piezoelectric material positioned proximate the magnetoelastic region of the insulating material. Applying an electric potential to the piezoelectric material transfers mechanical energy to the magnetoelastic region, causing the insulating material to change magnetic state.

As discussed above, the insulating material is capable of having magnetoelectric regions under certain conditions, such as a critical thickness, doping level, temperature, etc. Region 214 and region 212 may therefore be formed of slightly different compositions of similar materials, such that region 214 is magnetoelectric and region 212 is not. In one embodiment of the invention the insulating material is generally composed of $ABO_3$, where A is a member elected from the group consisting of Bi, Sr, Y, Ba, and La, and where B is a member elected from the group consisting of Fe, Mn, and Ru.

Once the insulating material between the source and drain electrodes is in the ferromagnetic state, spin-up electrons can easily tunnel through the insulating material, thereby allowing current to flow between the source and drain electrodes. Since the tunnel barrier height for spin-up electrons is lower than in the non-ferromagnetic case, the on-current is exponentially larger than the off-current:

$$I_{on} \approx \frac{1}{2} I_{off} \exp(2\Delta\kappa d)$$

where $$\Delta\kappa = \kappa - \kappa_\uparrow = \left[\frac{2mB}{\hbar^2}\right]^{1/2} - \left[\frac{2m(B - J/2)}{\hbar^2}\right]^{1/2}$$

This equation is derived by simply dividing equations 2 and 4, and relabelling $I_{NFM}$ to be $I_{off}$ and relabelling $I_{FM}$ to be $I_{on}$. Here d is the barrier thickness, B is the barrier height, and J is the exchange splitting in the ferromagnetic state. The spin-down current contribution in the ferromagnetic state is ignored. It is noted that the electrodes are assumed to be nonmagnetic for simplicity. The idea is that in the ferromagnetic (on) state, only the up spin electrons can tunnel, but they can tunnel very easily. As an example, for d=20 Å, B=0.8 eV, J=1.5 eV, the ratio of $I_{on}$ to $I_{off}$ is $10^6$. If an effective mass of twice the free electron is used, then the ratio increases to $4 \times 10^8$. The on current would be very large for this example because the effective barrier height for up spin in the on state is only 0.05 eV. Furthermore, the magnetic tunnel junction transistor contemplated by the present invention can be very fast since the transport is vertical through, for example, a thin 20 Å tunnel barrier.

Turning off the transistor requires de-energizing the insulating material. For example, when the second electric field at the gate region is removed the magnetoelectric region of the insulating layer reverts back to the non-ferromagnetic state. Due to magnetic exchange, the non-ferromagnetic state is induced throughout the insulating layer and causes the non-magnetoelectric region of the insulating layer to also revert back to the non-ferromagnetic state.

Figure 4:
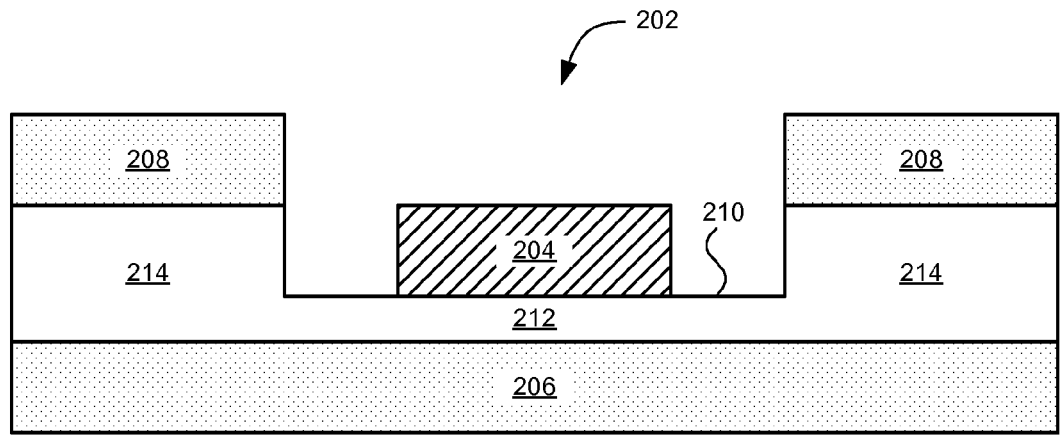
FIG. 4 shows another embodiment of the magnetic tunnel junction transistor contemplated by the present invention.

FIG. 4 shows another embodiment of the magnetic tunnel junction transistor 202 contemplated by the present invention. In this configuration, a plurality of magnetoelectric regions 214 are constructed around the non-magnetoelectric region 212. Creating multiple magnetoelectric regions 214 can help induce the magnetic state of the magnetoelectric regions 214 to the non-magnetoelectric region 212 by magnetic exchange.

Figure 5:
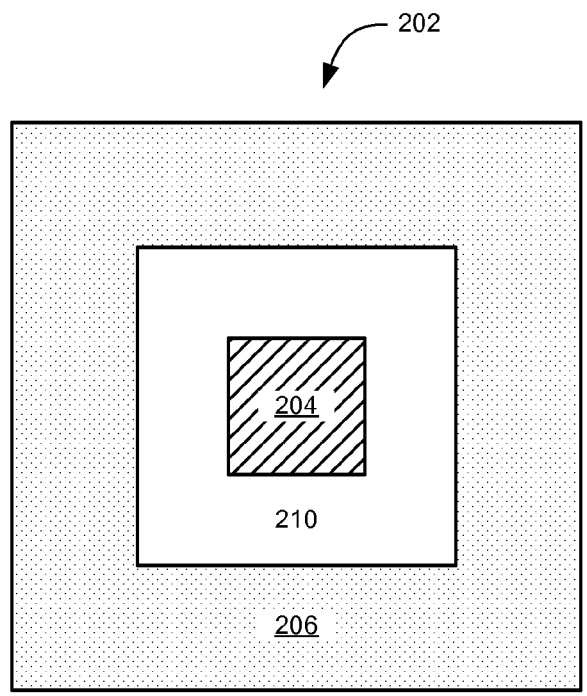
FIG. 5 shows another embodiment of the magnetic tunnel junction transistor contemplated by the present invention.

In FIG. 5, another embodiment of the magnetic tunnel junction transistor 202 contemplated by the present invention is shown. In this configuration, the magnetoelectric region of the insulating material 210 surrounds the non-magnetoelectric region. By doing so, the magnetic exchange force of the magnetoelectric region is further enhanced.

Figure 6:
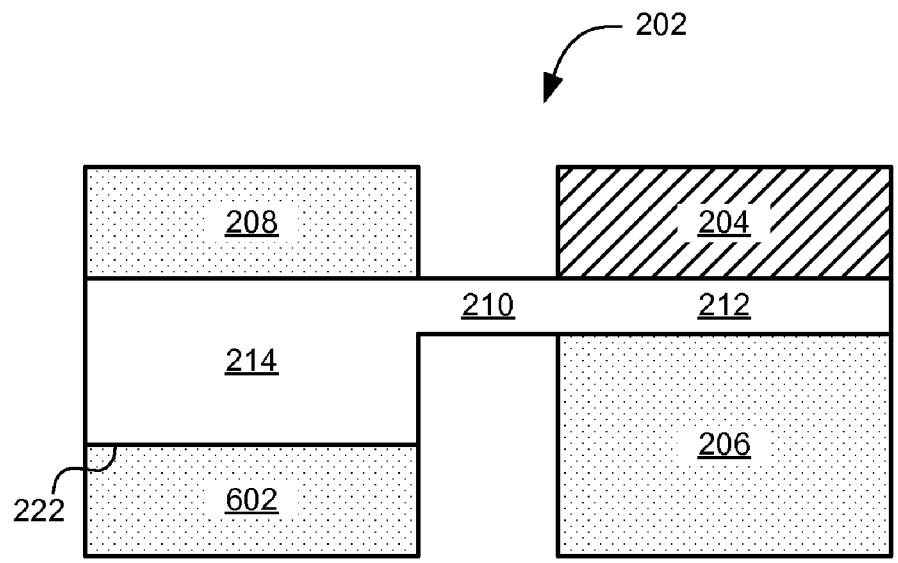
FIG. 6 shows another embodiment of the magnetic tunnel junction transistor contemplated by the present invention.

In FIG. 6, an additional embodiment of the magnetic tunnel junction transistor 202 contemplated by the present invention is shown. In this configuration, the magnetoelectric region 214 is disposed below the non-magnetoelectric region 212. Furthermore, a base electrode 602 separate from the drain electrode 206 is constructed underneath the magnetoelectric region 214. The base electrode 602 is electrically coupled to the second surface 222 of the second region 214. In this arrangement, when an electric field is applied between the gate electrode 208 and the base electrode 602, the insulating material changes magnetic state.

Figure 7:
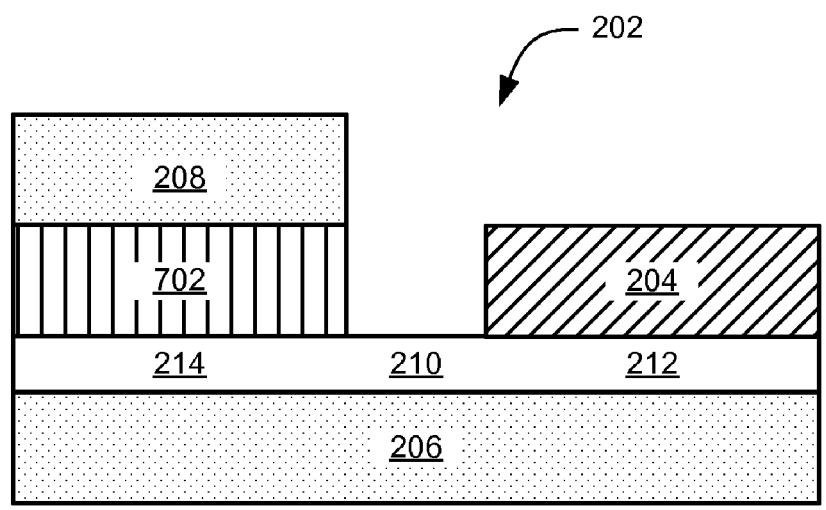
FIG. 7 shows another embodiment of the magnetic tunnel junction transistor contemplated by the present invention.

Yet another embodiment of the present invention is illustrated in FIG. 7. In this embodiment, a piezoelectric material 702 is positioned between the gate electrode 208 and the magnetoelectric region 214. In this case region 214 may or may not change magnetic state under an applied voltage. It must be magnetoelastic. The piezoelectric material 702 is configured to expand or contract in the presence of an electric field. Examples of piezoelectric materials include $BaTiO_3$ and $PbZr_xTi_{1-x}O_3$.

Energizing the magnetoelastic region 214 involves activating the piezoelectric material 702 by applying an electric field between the gate electrode 208 and the drain electrode region 206. In response, the piezoelectric material 702 expands or contracts, causing mechanical stress at the magnetoelastic region 214. The magnetoelastic region 214 reacts to the mechanical stress by changing magnetic state. The magnetic state of the magnetoelastic region 214, as discussed earlier, is induced to the non-magnetoelectric region 212 by magnetic exchange. Removing the electric field between the gate electrode 208 and the drain electrode 206 removes the mechanical stress at the magnetoelastic region 214 and reverses the magnetic state of the tunnel barrier region 212.

Figure 8:
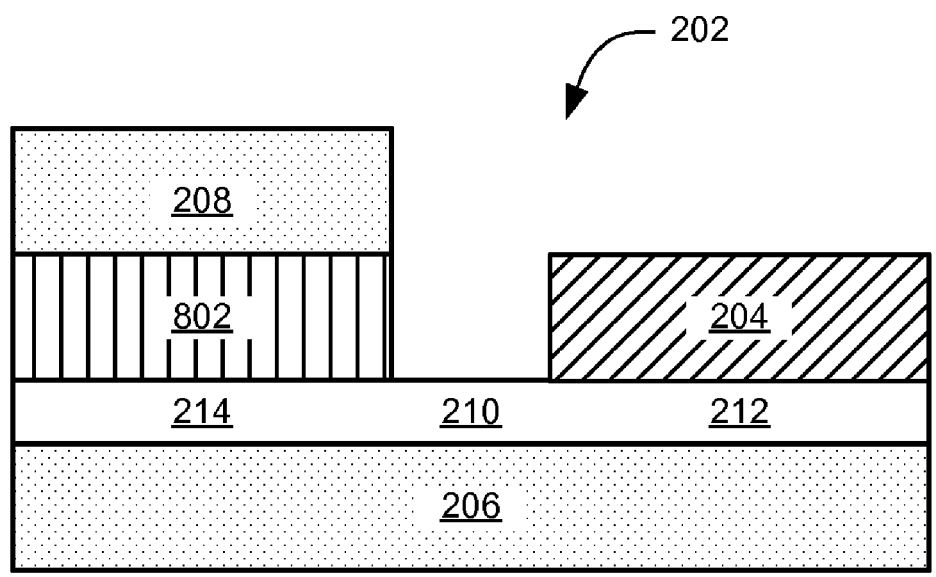
FIG. 8 shows another embodiment of the magnetic tunnel junction transistor contemplated by the present invention.

An additional embodiment of the present invention is illustrated in FIG. 8. In this embodiment, a ferromagnetic insulator 802 is positioned between the gate electrode 208 and the magnetoelectric region 214. Examples of ferromagnetic insulators include ferrites such as $Fe_3O_4$ and garnets such as $3Gd_2O_3 5Fe_2O_3$.

A thin film (less than 20 Å) of insulating material 210 is deposited above the drain electrode 206. The presence of the ferromagnetic insulator 802 proximate the insulating material 210 creates the magnetoelectric region 214 in the insulating material 210. Applying an electric field across magnetoelectric region 214 causes the insulating material 210 to change magnetic state. Thus, application of an electric potential at gate electrode 208 controls current flow between the source and drain electrodes 204, 206.

Having described preferred embodiments for the magnetic tunnel junction transistor (which are intended to be illustrative and not limiting), it is noted that modifications and variations can be made by persons skilled in the art in light of the above teachings. For example, other insulating materials capable of exhibiting magnetoelectric properties may be used with the present invention. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A magnetic tunnel junction transistor comprising:
   a tunnel barrier having a high resistance when in a non-ferromagnetic state, and a low resistance when in a ferromagnetic state, the tunnel barrier being switchable between the non-ferromagnetic and the ferromagnetic states.

2. The magnetic tunnel junction transistor of claim 1, wherein the tunnel barrier is an electrically insulating material.

3. The magnetic tunnel junction transistor of claim 1, wherein the tunnel barrier is less than 20 Angstroms thick.

4. The magnetic tunnel junction transistor of claim 1, wherein the tunnel barrier is BiFeO3.

5. The magnetic tunnel junction transistor of claim 1, wherein the tunnel barrier is Cr2O3.

6. The magnetic tunnel junction transistor of claim 1, wherein the tunnel barrier is ABO3;
   wherein A is a member or set of members elected from the group consisting of Bi, Sr, Y, Ba, and La; and
   wherein B is a member or set of members elected from the group consisting of Fe, Mn and Ru.

7. The magnetic tunnel junction transistor of claim 1, further comprising:
   an electrically conductive source electrode;
   an electrically conductive drain electrode; and
   wherein the tunnel barrier is positioned between the source electrode and the drain electrode.

8. The magnetic tunnel junction transistor of claim 7, wherein the tunnel barrier is non-magnetoelectric.

9. The magnetic tunnel junction transistor of claim 7, further comprising:
   an electrically insulating material having a first region and a second region, the electrically insulating material including the tunnel barrier in the first region, the electrically insulating material being switchable between the non-ferromagnetic and the ferromagnetic states; and
   an electrically conductive gate electrode positioned proximate the second region of the insulating material.

10. The magnetic tunnel junction transistor of claim 9, further comprising a ferromagnetic insulator positioned between the gate electrode and the second region.

11. The magnetic tunnel junction transistor of claim 9, wherein the second region of the insulating material is thicker than the tunnel barrier.

12. The magnetic tunnel junction transistor of claim 9, wherein the second region of the insulating material is greater than 20 Angstroms thick.

13. The magnetic tunnel junction transistor of claim 9, wherein the second region of the insulating material changes from the non-ferromagnetic state to the ferromagnetic state when energized.

14. The magnetic tunnel junction transistor of claim 9, further comprising a plurality of magnetoelectric regions in the insulating material, each of the magnetoelectric regions configured to change magnetic state when energized.

15. The magnetic tunnel junction transistor of claim 9, wherein the second region of the insulating material surrounds the tunnel barrier.

16. The magnetic tunnel junction transistor of claim 9, further comprising an electrically conductive base electrode proximate the second region of the insulating material such that the second region of the insulating material is positioned between the gate electrode and the base electrode.

17. The magnetic tunnel junction transistor of claim 9, wherein the second region of the insulating material is configured to change magnetic state when an electric field is applied across it.

18. The magnetic tunnel junction transistor of claim 9, further comprising:
   a piezoelectric material positioned between the gate electrode and the second region; and
   wherein second region is configured to change magnetic state when mechanical stress is applied to it by the piezoelectric material.

19. The magnetic tunnel junction transistor of claim 9, further comprising:
   wherein the source electrode is electrically coupled to a first surface of the tunnel barrier;
   wherein the drain electrode is electrically coupled to a second surface of the tunnel barrier; and
   wherein the gate electrode is electrically coupled to a first surface of the second region of the insulating material.

* * * * *